(12) United States Patent
Nguyen et al.

(10) Patent No.: US 12,451,838 B1
(45) Date of Patent: Oct. 21, 2025

(54) FAILSAFE FUNCTIONALITY FOR PHOTOVOLTAIC MODULES

(71) Applicant: GAF Energy LLC, Parsippany, NJ (US)

(72) Inventors: Thierry Nguyen, San Francisco, CA (US); Lewis Abra, San Francisco, CA (US); Babak Farhangi, Kew Gardens Hills, NY (US); Kishan Gondalia, San Jose, CA (US); Richard Perkins, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 18/906,925

(22) Filed: Oct. 4, 2024

Related U.S. Application Data

(60) Provisional application No. 63/588,526, filed on Oct. 6, 2023.

(51) Int. Cl.
  *H02S 20/23* (2014.01)
  *H02S 40/34* (2014.01)
  *H02S 50/00* (2014.01)

(52) U.S. Cl.
  CPC .............. *H02S 40/34* (2014.12); *H02S 20/23* (2014.12); *H02S 50/00* (2013.01)

(58) Field of Classification Search
  None
  See application file for complete search history.

(56) References Cited

U.S. PATENT DOCUMENTS

| | | |
|---|---|---|
| 1,981,467 A | 11/1934 | Radtke |
| 3,156,497 A | 11/1964 | Lessard |
| 3,581,779 A | 6/1971 | Gilbert, Jr. |

(Continued)

FOREIGN PATENT DOCUMENTS

| | | |
|---|---|---|
| CA | 2829440 A | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles> retrieved Feb. 2, 2021.

(Continued)

*Primary Examiner* — Eli S Mekhlin
(74) *Attorney, Agent, or Firm* — GREENBERG TRAURIG, LLP

(57) ABSTRACT

A system includes photovoltaic modules including a plurality of substrings installed on a roof deck. A printed circuit board of the system includes a bypass diode, a plurality of solder pads, and first and second low melting alloys connecting first and second solder pads. When the first and second low melting alloys reach a threshold temperature based on the occurrence of an event affecting the bypass diode, the first and second low melting alloys melt towards each other in a channel such that the first and second low melting allows connect to each other to form a continuous path between the first and second solder pads. The formed continuous path causes shorting of circuitry connecting at least one of the plurality of photovoltaic substrings to the first and second solder pads to provide a failsafe for at least one of the plurality of substrings.

20 Claims, 11 Drawing Sheets

(56) References Cited

U.S. PATENT DOCUMENTS

| | | |
|---|---|---|
| 4,258,948 A | 3/1981 | Hoffmann |
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,201,180 B1 | 3/2001 | Meyer et al. |
| 6,220,329 B1 | 4/2001 | King et al. |
| 6,308,482 B1 | 10/2001 | Strait |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Tino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,776,455 B2 | 7/2014 | Azoulay |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,153,950 B2 | 10/2015 | Yamanaka et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rodrigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,579,028 B1 | 3/2020 | Jacob |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,085,187 B2 | 8/2021 | Grubka et al. |
| 11,177,639 B1 | 11/2021 | Nguyen et al. |
| 11,217,715 B2 | 1/2022 | Sharenko et al. |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,309,828 B2 | 4/2022 | Sirski et al. |
| 11,394,344 B2 | 7/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 11,444,569 B2 | 9/2022 | Clemente et al. |
| 11,454,027 B2 | 9/2022 | Kuiper et al. |
| 11,459,757 B2 | 10/2022 | Nguyen et al. |
| 11,486,144 B2 | 11/2022 | Bunea et al. |
| 11,489,482 B2 | 11/2022 | Peterson et al. |
| 11,496,088 B2 | 11/2022 | Sirski et al. |
| 11,508,861 B1 | 11/2022 | Perkins et al. |
| 11,512,480 B1 | 11/2022 | Achor et al. |
| 11,527,665 B2 | 12/2022 | Boitnott |
| 11,545,927 B2 | 1/2023 | Abra et al. |
| 11,545,928 B2 | 1/2023 | Perkins et al. |
| 11,658,470 B2 | 5/2023 | Nguyen et al. |
| 11,661,745 B2 | 5/2023 | Bunea et al. |
| 11,689,149 B2 | 6/2023 | Clemente et al. |
| 11,705,531 B2 | 7/2023 | Sharenko et al. |
| 11,728,759 B2 | 8/2023 | Nguyen et al. |
| 11,732,490 B2 | 8/2023 | Achor et al. |
| 11,811,361 B1 | 11/2023 | Farhangi et al. |
| 11,824,486 B2 | 11/2023 | Nguyen et al. |
| 11,824,487 B2 | 11/2023 | Nguyen et al. |
| 11,843,067 B2 | 12/2023 | Nguyen et al. |

(56) References Cited

U.S. PATENT DOCUMENTS

| | | |
|---|---|---|
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2004/0000334 A1 | 1/2004 | Ressler |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2005/0193673 A1 | 9/2005 | Rodrigues et al. |
| 2006/0042683 A1 | 3/2006 | Gangemi |
| 2006/0046084 A1 | 3/2006 | Yang et al. |
| 2007/0074757 A1 | 4/2007 | Mellott et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Fath |
| 2009/0000222 A1 | 1/2009 | Kalkanoglu et al. |
| 2009/0014057 A1 | 1/2009 | Croft et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2009/0275247 A1 | 11/2009 | Richter et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0186798 A1 | 7/2010 | Tormen et al. |
| 2010/0242381 A1 | 9/2010 | Jenkins |
| 2010/0313499 A1 | 12/2010 | Gangemi |
| 2010/0325976 A1 | 12/2010 | DeGenfelder et al. |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2011/0314753 A1 | 12/2011 | Farmer et al. |
| 2012/0034799 A1 | 2/2012 | Hunt |
| 2012/0060434 A1 | 3/2012 | Jacobs |
| 2012/0060902 A1 | 3/2012 | Drake |
| 2012/0085392 A1 | 4/2012 | Albert et al. |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0282437 A1 | 11/2012 | Clark et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0118558 A1 | 5/2013 | Sherman |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0208675 A1 | 7/2014 | Beerer et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0294765 A1 | 10/2018 | Friedrich et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0083619 A1 | 3/2021 | Hegedus |
| 2021/0115223 A1 | 4/2021 | Bonekamp et al. |
| 2021/0159353 A1 | 5/2021 | Li et al. |
| 2021/0301536 A1 | 9/2021 | Baggs et al. |
| 2021/0343886 A1 | 11/2021 | Sharenko et al. |
| 2022/0149213 A1 | 5/2022 | Mensink et al. |

FOREIGN PATENT DOCUMENTS

| | | |
|---|---|---|
| CN | 202797032 U | 3/2013 |
| CN | 217150978 U | 8/2022 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 244648 A2 | 5/2012 |
| EP | 2784241 A1 | 10/2014 |
| EP | 3772175 A1 | 2/2021 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-1348283 B1 | 1/2014 |
| KR | 10-2019-0000367 A | 1/2019 |
| KR | 10-2253483 B1 | 5/2021 |

(56) References Cited

FOREIGN PATENT DOCUMENTS

| | | |
|---|---|---|
| NL | 2026856 B1 | 6/2022 |
| WO | 2010/151777 A2 | 12/2010 |
| WO | 2011/049944 A1 | 4/2011 |
| WO | 2015/133632 A1 | 9/2015 |
| WO | 2018/000589 A1 | 1/2018 |
| WO | 2019/201416 A1 | 10/2019 |
| WO | 2020-159358 A1 | 8/2020 |
| WO | 2021-247098 A1 | 12/2021 |

OTHER PUBLICATIONS

RGS Energy, 3.5KW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

| Solder Alloy | Melting Range (°C) | Typical Peak Reflow Temperature (°C) |
|---|---|---|
| Sn63/Pb37 | 183 | 210 – 220 |
| Sn96.5/Ag3.0/Cu0.5 (SAC305) | 217 – 221 | 240 – 250 |
| Sn99.3/Cu0.7/Ni0.05/Ge0.005 (SN100C®) | 227 | 245 – 255 |
| Sn89.0/Ag3.0/Bi0.5/In8.0 | 200 – 205 | 220 – 230 |
| Sn88.0/Ag3.0/Bi0.5/Cu0.5/In8.0 | 197 – 202 | 215 – 225 |
| Sn48/In52 | 118 | 140 – 150 |
| Sn42/Bi58 | 138 | 160 – 170 |
| Sn42/Bi57/Ag1.0 | 138 – 140 | 160 – 170 |

FIG. 11

FAILSAFE FUNCTIONALITY FOR PHOTOVOLTAIC MODULES

CROSS-REFERENCE TO RELATED APPLICATIONS

The present application claims priority to and the benefit of U.S. Provisional Patent Application No. 63/588,526, filed Oct. 6, 2023, the entirety of which is hereby incorporated by reference.

FIELD OF THE INVENTION

The present application relates to photovoltaic modules, failsafe functionality technologies, roofing accessories and technologies, and, more particularly, to failsafe functionality for photovoltaic modules.

BACKGROUND

Photovoltaic systems are installed on building roofs to generate electricity.

SUMMARY

A system can include a plurality of photovoltaic modules installed on a roof deck of a structure, wherein each of the plurality of photovoltaic modules comprise a plurality of photovoltaic substrings comprising a plurality of photovoltaic cells. In certain embodiments, the system can include a printed circuit board electrically connected to the plurality of photovoltaic modules installed on the roof deck of the structure. In certain embodiments, the printed circuit board can include at least one bypass diode configured to bypass, upon occurrence of a condition, at least one photovoltaic substring of the plurality of photovoltaic substrings, a plurality of solder pads connected to the at least one bypass diode, a channel, and a casing connected to a first solder pad and a second solder pad of the plurality of solder pads. In certain embodiments, the casing is configured to cover a first low melting alloy and a second low melting alloy. In certain embodiments, when the first low melting alloy and the second low melting alloy reach a threshold temperature based on an event affecting the at least one bypass diode, the first low melting alloy and the second low melting alloy melt towards each other in the channel such that the first low melting alloy and the second low melting alloy connect to each other to form a continuous path between the first solder pad and the second solder pad, thereby shorting circuitry connecting at least one of the plurality of photovoltaic substrings to the first solder pad, the second solder pad, or a combination thereof, to provide a failsafe for the at least one of the plurality of substrings by bypassing the at least one bypass diode.

In certain embodiments, the system can further include a bussing connected to the first solder pad, the second solder pad, or a combination thereof, that connects to the at least one of the plurality of photovoltaic substrings. In certain embodiments, when the threshold temperature is no longer present, the first low melting alloy and the second low melting alloy convert to a solid state, thereby causing disconnection between the first low melting alloy and the second low melting alloy within the channel, thereby forming a non-continuous path between the first solder pad and the second solder pad. In certain embodiments, the system can include a junction box configured to house the printed circuit board and connect with the plurality of photovoltaic modules. In certain embodiments, the printed circuit board can be laminated within at least one of the photovoltaic modules of the plurality of photovoltaic modules.

In certain embodiments, casing can be configured to cover the first low melting alloy, the second low melting alloy, the channel, or a combination thereof. In certain embodiments, the printed circuit board further comprises a temperature-activated switch in proximity to the at least one bypass diode. In certain embodiments, the temperature-activated switch is configured to close the circuitry and bypass the at least one bypass diode when the threshold temperature is reached based on the event. In certain embodiments, the temperature-activated switch is further configured to open when the threshold temperature is not reached.

In certain embodiments, the system further includes a third low melting alloy configured to connect the first solder pad to a third solder pad, thereby forming a first bridge in series with the at least one of the plurality of photovoltaic substrings. In certain embodiments, the system further includes a fourth low melting alloy configured to connect the second solder pad to fourth solder pad, thereby forming a second bridge at least one other photovoltaic substring of the plurality of photovoltaic substrings. In certain embodiments, when the threshold temperature based on the event is reached, the first bridge, the second bridge, or a combination thereof, melt and collapse, thereby opening the circuitry connecting to the at least one of the plurality of photovoltaic substrings.

In certain embodiments, the system further includes a temperature-activated switch positioned in series with the at least one of the plurality of photovoltaic substrings, wherein the temperature-activated switch is configured to: remain closed in a default state, and open when the threshold temperature based on the event is reached, thereby opening the circuitry connecting to the at least one of the plurality of photovoltaic substrings.

A method can include installing a plurality of photovoltaic modules comprising a plurality of photovoltaic substrings on a roof deck. In certain embodiments, the at least one of the plurality of plurality of photovoltaic modules can include a printed circuit board electrically connected to the plurality of photovoltaic modules installed on the roof deck of the structure. In certain embodiments, the printed circuit board can include at least one bypass diode configured to bypass, upon occurrence of a condition, at least one photovoltaic substring of the plurality of photovoltaic substrings; a plurality of solder pads connected to the at least one bypass diode; a channel; and a casing connected to a first solder pad and a second solder pad of the plurality of solder pads. In certain embodiments, the casing can include or cover a first low melting alloy and a second low melting alloy. In certain embodiments, the method can include facilitating, when a threshold temperature based on an event is reached at the first low melting alloy and the second low melting alloy, a connection between the first low melting alloy and the second low melting alloy as the first low melting alloy and the second low melting alloy melt towards each other via the channel, the connection forming a continuous path between the first solder pad and the second solder pad. In certain embodiments, the method can include shorting circuitry connecting at least one of the plurality of photovoltaic substrings to the first solder pad, the second solder pad, or a combination thereof, to provide a failsafe for the at least one of the plurality of substrings by bypassing the at least one bypass diode.

In certain embodiments, the method can further include forming a non-continuous path between the first solder pad and the second solder pad when the threshold temperature is no longer present, wherein the non-continuous path is formed based on disconnection between the first low melting alloy and the second low melting alloy within the channel as the first low melting alloy and the second low melting alloy convert to a solid state. In certain embodiments, the method can include closing the circuitry and bypassing the at least one bypass diode by utilizing a temperature-activated switch in proximity to the at least one bypass diode that is activated when the threshold temperature based on the event is reached. In certain embodiments, the method can include opening the circuitry when the threshold temperature is not reached.

In certain embodiments, the method can include forming a bridge in series with that least one of the plurality of photovoltaic substrings using a third low melting allow configured to connect the first solder pad to a third solder pad. In certain embodiments, the method can include opening the circuitry connecting to the at least one of the plurality of photovoltaic substrings when the threshold temperature based on the event is reached.

A shingle can include a plurality of photovoltaic modules comprising a plurality of photovoltaic substrings installed on a roof deck of a structure, and a printed circuit board electrically connected to the plurality of photovoltaic modules comprising the plurality of photovoltaic substrings. In certain embodiments, the printed circuit board can include at least one bypass diode configured to bypass, upon occurrence of a condition, at least one photovoltaic substring of the plurality of photovoltaic substrings; a plurality of solder pads connected to the at least one bypass diode; a channel; and a casing connected to a first solder pad and a second solder pad of the plurality of solder pads. In certain embodiments, the casing can include a first low melting alloy and a second low melting alloy. In certain embodiments, when the first low melting alloy and the second low melting alloy reach a threshold temperature based on an event affecting the at least one bypass diode, the first low melting alloy and the second low melting alloy melt within in the channel such that the first low melting alloy and the second low melting alloy connect to each other to form a continuous path between the first solder pad and the second solder pad, thereby shorting circuitry connecting at least one of the plurality of photovoltaic substrings to the first solder pad, the second solder pad, or a combination thereof, to provide a failsafe for the at least one of the plurality of substrings by bypassing the at least one bypass diode.

In certain embodiments, the shingle can further include a temperature-activated switch positioned in series with the at least one of the plurality of photovoltaic substrings, wherein the temperature-activated switch is configured to: open when the threshold temperature based on the event is reached, thereby opening the circuitry connecting to the at least one of the plurality of photovoltaic substrings. In certain embodiments, the shingle can further include a third low melting alloy configured to connect the first solder pad to a third solder pad, thereby forming a first bridge in series with the at least one of the plurality of photovoltaic substrings; and a fourth low melting alloy configured to connect the second solder pad to fourth solder pad, thereby forming a second bridge at least one other photovoltaic substring of the plurality of photovoltaic substrings, wherein, when the threshold temperature based on the event is reached, the first bridge, the second bridge, or a combination thereof, melt and collapse, thereby opening the circuitry connecting to the at least one of the plurality of photovoltaic substrings.

BRIEF DESCRIPTION OF THE DRAWINGS

FIG. 11 illustrates exemplary low melting alloys for use in providing failsafe functionality according to embodiments of the present disclosure.

DETAILED DESCRIPTION

Figure 1B:
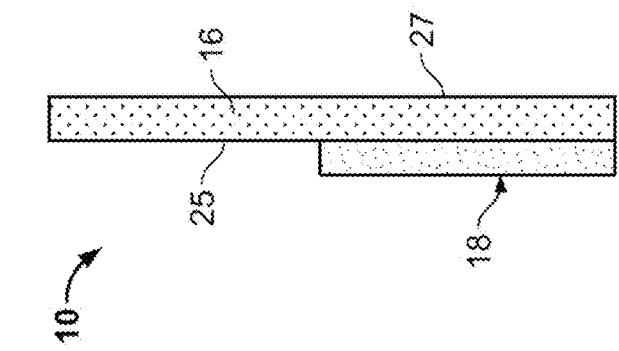
FIGS. 1A and 1B are a top plan view and side elevational view, respectively, of certain embodiments of a photovoltaic module.

Systems, photovoltaic shingles, photovoltaic modules incorporating printed circuit boards and accompanying components for providing failsafe functionality for photovoltaic modules are disclosed herein. Photovoltaic modules generate electricity when exposed to sunlight and often generate heat based on their operation. Events arise, such as when a temperature of the photovoltaic module or components therein increase beyond the photovoltaic module's normal operating range. Events, such as excessive temperatures, which are often caused by high environmental temperatures, inadequate ventilation, component malfunctions, and ineffective airflow around the photovoltaic modules, can lead to reduced electricity generation, increased electrical resistance, degradation of photovoltaic module components, and reduced efficiency. Other types of events can occur, such as, but not limited to, a malfunction of a component of a photovoltaic system or module, a short circuit within circuitry of the photovoltaic system or module, environmental conditions (e.g., weather, pressure, humidity, etc.), a deterioration of a component of a photovoltaic system or module, other types of events, or a combination thereof. When an event occurs, having the capability to be able to set a photovoltaic module or substring in a closed or open state can provide failsafe protection and functionality to the module or substring. According to embodiments of the present disclosure, such protection and functionality can be incorporated into a printed circuit board that can be in-laminated into photovoltaic modules or housed within junction boxes connected to the photovoltaic modules. In particular, embodiments of the present disclosure integrate substring or laminate shorting functionality into a printed circuit board, and/or integrate substring or laminate open functionality into a printed circuit board.

Bypass diodes are semiconductor devices that are utilized in certain photovoltaic systems and modules to minimize the negative effects of shading or obstruction of modules and extreme hotspots. Such bypass diodes are typically connected in parallel with photovoltaic substrings including photovoltaic cells. When a portion of a photovoltaic module or cell is shaded and/or is not producing electricity according to expectations, the operation of the bypass diode can automatically be triggered and can become forward-biased to provide an alternate path for the electric current coursing through the circuitry of the photovoltaic module to flow around the shaded and/or obstructed photovoltaic string or cell(s). By providing the foregoing functionality, the shaded or obstructed strings or cells are isolated from other strings or cells and are prevented from hindering the performance of the photovoltaic module as a whole.

Despite the foregoing capabilities of bypass diodes, bypass diodes do have certain characteristics that the embodiments of the present disclosure counteract or minimize. When a bypass diode conducts (i.e., activates), such as during shading or obstruction, the photovoltaic strings or cells in parallel with the bypass diode will conduct current and may load a photovoltaic cell contained therein, which can lead to the creation of hotspots. In the event an event, such as a hotspot, occurs, the bypass diode can be damaged and may generate a local hot spot. In such a scenario, embodiments of the present disclosure can provide failsafe functionality to short the photovoltaic substring. In the event that the bypass diode is shunted (i.e., a resistive short), the bypass diode will generate heat before it fails to open, which creates a risky situation. Also, when the bypass diode fails to open, the photovoltaic substring can lose the protection against breakdown voltages and extreme hotspots. In such a scenario, embodiments of the present disclosure provide failsafe functionality to open the circuitry associated with the bypass diode and/or substring.

Embodiments of the present disclosure incorporate the use of low melting temperature alloys or metal, which can be applied as traces or thin wires into a printed circuit board design for use with photovoltaic modules and/or substrings. In certain embodiments, the low reflow temperatures of such alloys can be utilized to reconnect a non-continuous path when the low melting allow reaches a melting temperature and creates a short in the circuit connected to the photovoltaic substrings of the photovoltaic module. In certain embodiments, another technique for establishing the shorting is to employ the use of a temperature-actuated/activated switch that can be in proximity to the bypass diodes or bypass circuitry. In certain embodiments, if the bypass diode generates excessive heat above a designed specification, the temperature-actuated/activated switch will close the circuit containing the bypass diode and bypasses the failed bypass diode. In certain embodiments, the closing of the circuit can be permanent or reversible. In certain embodiments, when reversible, the temperature-actuated/activated switch can only activate when the primary bypass diode is overheating and can be open when there is no temperature rise occurring.

In certain embodiments, another option is to provide open failsafe functionality. As with the shorting failsafe functionality, the open failsafe functionality can incorporate the use of low melting alloys that have low reflow temperatures. In certain embodiments, the alloy can form or constitute a bridge in series with each photovoltaic substring of a photovoltaic module. When the temperature exceeds the melting point for the alloy, the bridge can collapse and open the circuit connected to the bypass diode and substring(s). In certain embodiments, additional open failsafe functionality can be provided. For example, a normally-closed temperature activated switch can be utilized in series with a photovoltaic substring. In certain embodiments, the temperature activated switch can be adjacent to a hotspot from the bypass circuit associated with the bypass diode or have feedback from the corresponding area. In instances when there is overheating occurring, the switch can be opened and can cut the current flowing through to the photovoltaic substring. In certain embodiments, the switch can be utilized to separate the photovoltaic substring from the string volage and can eliminate the risk of photovoltaic cells going into a breakdown mode.

In certain embodiments, both shorting failsafe functionality and open failsafe functionality can be incorporated into the printed circuit board. In certain embodiments, the open and closed states of the circuit connected to the photovoltaic substrings and/or bypass diodes can be managed and/or controlled by utilizing a microchip that can measure temperature at various locations of the printed circuit board using any types of integrated circuit sensors, such as, but not limited to, temperature sensors, light sensors, heat sensors, and/or other types of sensors.

In certain embodiments, a system for providing failsafe functionality for photovoltaic modules can be provided. In certain embodiments, the system can include a plurality of photovoltaic modules installed on a roof deck of a structure, wherein each of the plurality of photovoltaic modules comprise a plurality of photovoltaic substrings comprising a plurality of photovoltaic cells. In certain embodiments, the system can include a printed circuit board electrically connected to the plurality of photovoltaic modules installed on the roof deck of the structure. In certain embodiments, the printed circuit board can include at least one bypass diode configured to bypass, upon occurrence of a condition, at least one photovoltaic substring of the plurality of photovoltaic substrings, a plurality of solder pads connected to the at least one bypass diode, a channel, and a casing connected to a first solder pad and a second solder pad of the plurality of solder pads. In certain embodiments, the casing can be configured to cover a first low melting alloy and a second low melting alloy. In certain embodiments, when the first low melting alloy and the second low melting alloy reach a threshold temperature based on an event affecting the at least one bypass diode, the first low melting alloy and the second low melting alloy melt towards each other in the channel such that the first low melting alloy and the second low melting alloy connect to each other to form a continuous path between the first solder pad and the second solder pad, thereby shorting circuitry connecting at least one of the plurality of photovoltaic substrings to the first solder pad, the second solder pad, or a combination thereof, to provide a failsafe for the at least one of the plurality of substrings.

In certain embodiments, the system can further include a bussing connected to the first solder pad, the second solder pad, or a combination thereof, that connects to the at least one of the plurality of photovoltaic substrings. In certain embodiments, when the threshold temperature is no longer present, the first low melting alloy and the second low melting alloy convert to a solid state, thereby causing disconnection between the first low melting alloy and the second low melting alloy within the channel, thereby forming a non-continuous path between the first solder pad and the second solder pad. In certain embodiments, the system can include a junction box configured to house the printed circuit board and connect with the plurality of photovoltaic modules. In certain embodiments, the printed circuit board can be laminated within at least one of the photovoltaic modules of the plurality of photovoltaic modules.

In certain embodiments, casing can be configured to cover the first low melting alloy, the second low melting alloy, the channel, or a combination thereof. In certain embodiments, the printed circuit board further comprises a temperature-activated switch in proximity to the at least one bypass diode. In certain embodiments, the temperature-activated switch is configured to close the circuitry and bypass the at least one bypass diode when the threshold temperature is reached based on the event. In certain embodiments, the temperature-activated switch is further configured to open when the threshold temperature is not reached.

In certain embodiments, the system further includes a third low melting alloy configured to connect the first solder pad to a third solder pad, thereby forming a first bridge in series with the at least one of the plurality of photovoltaic substrings. In certain embodiments, the system further includes a fourth low melting alloy configured to connect the second solder pad to fourth solder pad, thereby forming a second bridge at least one other photovoltaic substring of the plurality of photovoltaic substrings. In certain embodiments, when the threshold temperature based on the event is reached, the first bridge, the second bridge, or a combination thereof, melt and collapse, thereby opening the circuitry connecting to the at least one of the plurality of photovoltaic substrings.

In certain embodiments, the system further includes a temperature-activated switch positioned in series with the at least one of the plurality of photovoltaic substrings, wherein the temperature-activated switch is configured to: remain closed in a default state, and open when the threshold temperature based on the event is reached, thereby opening the circuitry connecting to the at least one of the plurality of photovoltaic substrings.

A method can include installing a plurality of photovoltaic modules comprising a plurality of photovoltaic substrings on a roof deck. In certain embodiments, the at least one of the plurality of plurality of photovoltaic modules can include a printed circuit board electrically connected to the plurality of photovoltaic modules installed on the roof deck of the structure. In certain embodiments, the printed circuit board can include at least one bypass diode configured to bypass, upon occurrence of a condition, at least one photovoltaic substring of the plurality of photovoltaic substrings; a plurality of solder pads connected to the at least one bypass diode; a channel; and a casing connected to a first solder pad and a second solder pad of the plurality of solder pads. In certain embodiments, the casing can include or cover a first low melting alloy and a second low melting alloy. In certain embodiments, the method can include facilitating, when a threshold temperature based on an event is reached at the first low melting alloy and the second low melting alloy, a connection between the first low melting alloy and the second low melting alloy as the first low melting alloy and the second low melting alloy melt towards each other via the channel, the connection forming a continuous path between the first solder pad and the second solder pad. In certain embodiments, the method can include shorting circuitry connecting at least one of the plurality of photovoltaic substrings to the first solder pad, the second solder pad, or a combination thereof, to provide a failsafe for the at least one of the plurality of substrings.

In certain embodiments, the method can further include forming a non-continuous path between the first solder pad and the second solder pad when the threshold temperature is no longer present, wherein the non-continuous path is formed based on disconnection between the first low melting alloy and the second low melting alloy within the channel as the first low melting alloy and the second low melting alloy convert to a solid state. In certain embodiments, the method can include closing the circuitry and bypassing the at least one bypass diode by utilizing a temperature-activated switch in proximity to the at least one bypass diode that is activated when the threshold temperature based on the event is reached. In certain embodiments, the method can include opening the circuitry when the threshold temperature is not reached.

In certain embodiments, the method can include forming a bridge in series with that least one of the plurality of photovoltaic substrings using a third low melting allow configured to connect the first solder pad to a third solder pad. In certain embodiments, the method can include opening the circuitry connecting to the at least one of the plurality of photovoltaic substrings when the threshold temperature based on the event is reached.

A shingle can include a plurality of photovoltaic modules comprising a plurality of photovoltaic substrings installed on a roof deck of a structure, and a printed circuit board electrically connected to the plurality of photovoltaic modules comprising the plurality of photovoltaic substrings. In certain embodiments, the printed circuit board can include at least one bypass diode configured to bypass, upon occurrence of a condition, at least one photovoltaic substring of the plurality of photovoltaic substrings; a plurality of solder pads connected to the at least one bypass diode; a channel; and a casing connected to a first solder pad and a second solder pad of the plurality of solder pads. In certain embodiments, the casing can include a first low melting alloy and a second low melting alloy. In certain embodiments, when the first low melting alloy and the second low melting alloy reach a threshold temperature based on an event affecting the at least one bypass diode, the first low melting alloy and the second low melting alloy melt within in the channel such that the first low melting alloy and the second low melting alloy connect to each other to form a continuous path between the first solder pad and the second solder pad, thereby shorting circuitry connecting at least one of the plurality of photovoltaic substrings to the first solder pad, the second solder pad, or a combination thereof, to provide a failsafe for the at least one of the plurality of substrings.

In certain embodiments, the shingle can further include a temperature-activated switch positioned in series with the at least one of the plurality of photovoltaic substrings, wherein the temperature-activated switch is configured to: open when the threshold temperature based on the event is reached, thereby opening the circuitry connecting to the at least one of the plurality of photovoltaic substrings. In certain embodiments, the shingle can further include a third low melting alloy configured to connect the first solder pad to a third solder pad, thereby forming a first bridge in series with the at least one of the plurality of photovoltaic substrings; and a fourth low melting alloy configured to connect the second solder pad to fourth solder pad, thereby forming a second bridge at least one other photovoltaic substring of the plurality of photovoltaic substrings, wherein, when the threshold temperature based on the event is reached, the first bridge, the second bridge, or a combination thereof, melt and collapse, thereby opening the circuitry connecting to the at least one of the plurality of photovoltaic substrings.

Figure 1A:
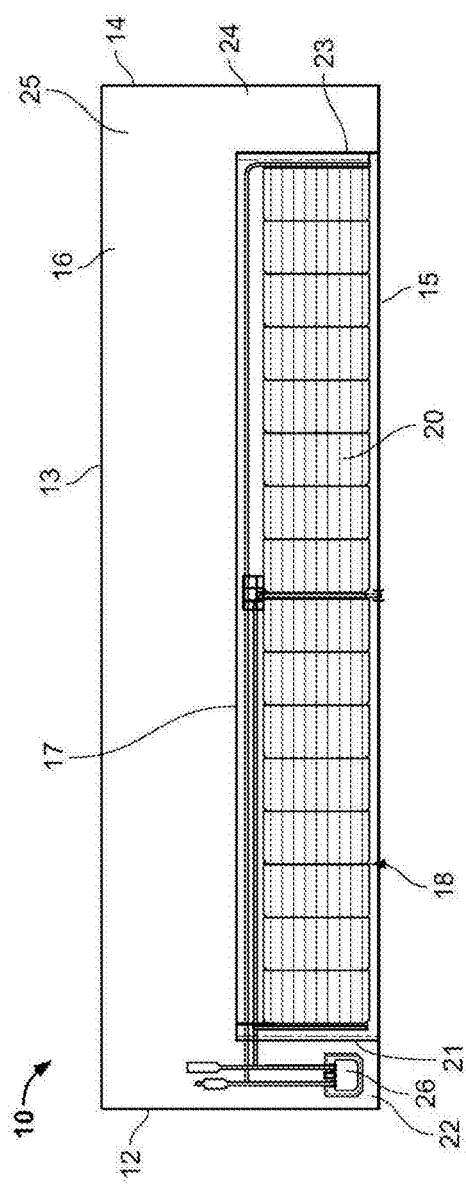

Referring to FIGS. 1A and 1B, in certain embodiments, a photovoltaic module 10 for use with the embodiments of the present disclosure includes a first end 12, a second end 14 opposite the first end 12, a first edge 13 extending from the first end 12 to the second end 14, and a second edge 15 opposite the first edge 13 and extending from the first end 12 to the second end 14. In certain embodiments, the photovoltaic module 10 includes a headlap portion 16. In certain embodiments, the headlap portion 16 extends from the first end 12 to the second end 14 and from the first edge 13 to a first location 17 between the first edge 13 and the second edge 15. In certain embodiments, the photovoltaic module 10 includes a reveal portion 18. In certain embodiments, the reveal portion 18 includes at least one solar cell 20. In certain embodiments, the photovoltaic module 10 includes a first side lap 22 located at the first end 12. In certain embodiments, the first side lap 22 includes a length extending from the first end 12 to a second location 21 between the first end 12 and the second end 14. In certain embodiments, the photovoltaic module 10 includes a second side lap 24 located at the second end 14. In certain embodiments, the second side lap 24 includes a length extending from the second end 14 to a third location 23 between the first end 12 and the second end 14. In certain embodiments, the photovoltaic module 10 includes an outer surface 25 and an inner surface 27 opposite the outer surface 25. In certain embodiments, the reveal portion 18 extends from the first side lap 22 to the second side lap 24 and from the second edge 15 to the first location 17. In certain embodiments, the photovoltaic module 10 is configured to be installed on a building structure. In certain embodiments, the photovoltaic module 10 is configured to be installed on an exterior wall of a building structure as described in further detail below. In certain embodiments, at least one junction box 26 is located on the first side lap 22. In certain embodiments, the at least one junction box 26 includes a plurality of the junction boxes 26. In certain embodiments, the photovoltaic module 10 includes a structure, composition, components, and/or function similar to those of one or more embodiments of the photovoltaic modules disclosed in PCT International Patent Publication No. WO 2022/051593, Application No. PCT/US2021/049017, published Mar. 10, 2022, entitled Building Integrated Photovoltaic System, owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in its entirety.

In certain embodiments, the at least one solar cell 20 includes a plurality of the solar cells 20. In certain embodiments, the plurality of solar cells 20 includes two solar cells. In certain embodiments, the plurality of solar cells 20 includes three solar cells. In certain embodiments, the plurality of solar cells 20 includes four solar cells. In certain embodiments, the plurality of solar cells 20 includes five solar cells. In certain embodiments, the plurality of solar cells 20 includes six solar cells. In certain embodiments, the plurality of solar cells 20 includes seven solar cells. In certain embodiments, the plurality of solar cells 20 includes eight solar cells. In certain embodiments, the plurality of solar cells 20 includes nine solar cells. In certain embodiments, the plurality of solar cells 20 includes ten solar cells. In certain embodiments, the plurality of solar cells 20 includes eleven solar cells. In certain embodiments, the plurality of solar cells 20 includes twelve solar cells. In certain embodiments, the plurality of solar cells 20 includes thirteen solar cells. In certain embodiments, the plurality of solar cells 20 includes fourteen solar cells. In certain embodiments, the plurality of solar cells 20 includes fifteen solar cells. In certain embodiments, the plurality of solar cells 20 includes sixteen solar cells. In certain embodiments, the plurality of solar cells 20 includes more than sixteen solar cells.

In certain embodiments, the plurality of solar cells 20 is arranged in one row (i.e., one reveal). In another embodiment, the plurality of solar cells 20 is arranged in two rows (i.e., two reveals). In another embodiment, the plurality of solar cells 20 is arranged in three rows (i.e., three reveals). In another embodiment, the plurality of solar cells 20 is arranged in four rows (i.e., four reveals). In another embodiment, the plurality of solar cells 20 is arranged in five rows (i.e., five reveals). In another embodiment, the plurality of solar cells 20 is arranged in six rows (i.e., six reveals). In other embodiments, the plurality of solar cells 20 is arranged in more than six rows. In certain embodiments, the at least one solar cell 20 is electrically inactive (i.e., a "dummy" solar cell).

Figure 3:
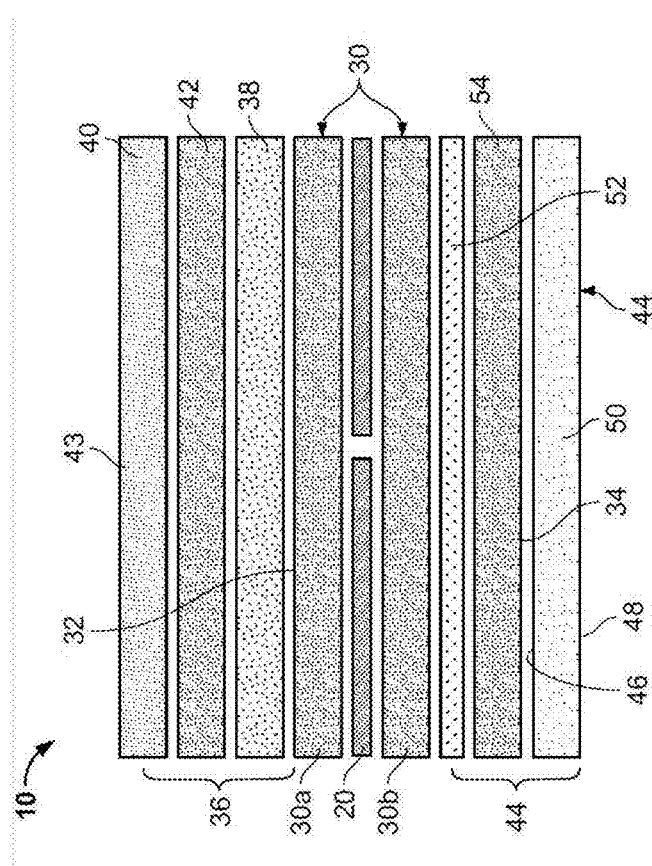
FIGS. 2 and 3 are schematic views of certain embodiments of a photovoltaic module.
Figure 2:
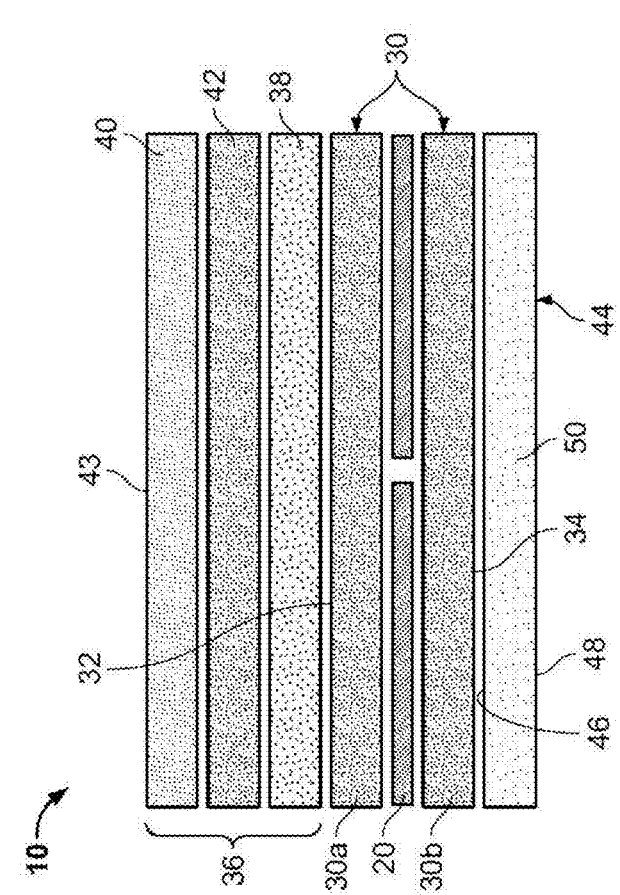

Referring to FIGS. 2 and 3, in certain embodiments, the photovoltaic module 10 includes an encapsulant 30 encapsulating the at least one solar cell 20. In certain embodiments, the encapsulant 30 includes a first layer 30a having a first surface 32 and a second layer 30b having a second surface 34 opposite the first surface 32. In certain embodiments, the photovoltaic module 10 includes a frontsheet 36 juxtaposed with the first surface 32 of the first layer 30a of the encapsulant 30. In certain embodiments, the frontsheet 36 includes a glass layer 38. In certain embodiments, the frontsheet 36 includes a polymer layer 40 attached to the glass layer 38. In certain embodiments, the polymer layer 40 forms an upper surface of the photovoltaic module 10.

In certain embodiments, the polymer layer 40 is attached to the glass layer 38 by a first adhesive layer 42. In certain embodiments, an upper surface 43 of the polymer layer 40 is an upper surface of the photovoltaic module 10. In certain embodiments, the upper surface 43 of the polymer layer 40 is textured. In certain embodiments, the upper surface 43 of the polymer layer 40 is embossed. In certain embodiments, the upper surface 43 of the polymer layer 40 is embossed with a plurality of indentations. In certain embodiments, the upper surface 43 of the polymer layer 40 includes a pattern. In certain embodiments, the upper surface 43 of the polymer layer 40 includes a printed pattern. In certain embodiments, the upper surface 43 of the polymer layer 40 includes an embossed pattern. In certain embodiments, the upper surface 43 of the polymer layer 40 includes a textured pattern.

In certain embodiments, the photovoltaic module 10 includes a backsheet 44. In certain embodiments, the backsheet 44 is juxtaposed with the second surface 34 of the second layer 30b of the encapsulant 30. In certain embodiments, the backsheet 44 includes a first surface 46 and a second surface 48 opposite the first surface 46 of the backsheet 44. In certain embodiments, the second surface 48 of the backsheet 44 forms a lower surface of the photovoltaic module 10. In certain embodiments, the backsheet 44 includes a first layer 50. In certain embodiments, the backsheet 44 includes a second layer 52 (see FIG. 3). In certain embodiments, the second layer 52 is attached to the first layer 50 by a second adhesive layer 54. In certain embodiments, the backsheet 44 includes only one layer (see FIG. 2). In certain embodiments, the backsheet 44 includes only the first layer 50 (see FIG. 2). In certain embodiments, the backsheet 44 does not include the second layer 52 (see FIG. 2). In certain embodiments, the backsheet 44 is composed of a polymer. In certain embodiments, the backsheet 44 is composed of thermoplastic polyolefin (TPO). In certain embodiments, the backsheet 44 forms the headlap portion 16.

In certain embodiments, each of the encapsulant 30, the frontsheet 36, including each of the glass layer 38, the polymer layer 40, and the first adhesive layer 42, and the backsheet 44, including the first layer 50, the second layer 52, and the second adhesive layer 54 of the photovoltaic module 10, as applicable, includes a structure, composition and/or function of similar to those of more or one of the embodiments of the corresponding components disclosed in PCT International Patent Publication No. WO 2022/051593, Application No. PCT/US2021/049017, published Mar. 10, 2022, entitled Building Integrated Photovoltaic System, owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in its entirety.

In certain embodiments, the photovoltaic module 10 includes a structure, composition, components, and/or function similar to those of one or more embodiments of the photovoltaic roofing shingles disclosed in U.S. application Ser. No. 17/831,307, filed Jun. 2, 2022, titled "Roofing Module System," and published under U.S. Patent Application Publication No. 2022-0393637 on Dec. 8, 2022; and/or U.S. application Ser. No. 18/169,718, filed Feb. 15, 2023, titled "Roofing Module System," and published under U.S. Patent Application Publication No. 2023-0203815 on Jun. 29, 2023, the contents of each of which are incorporated by reference herein in its entirety.

Figure 4:
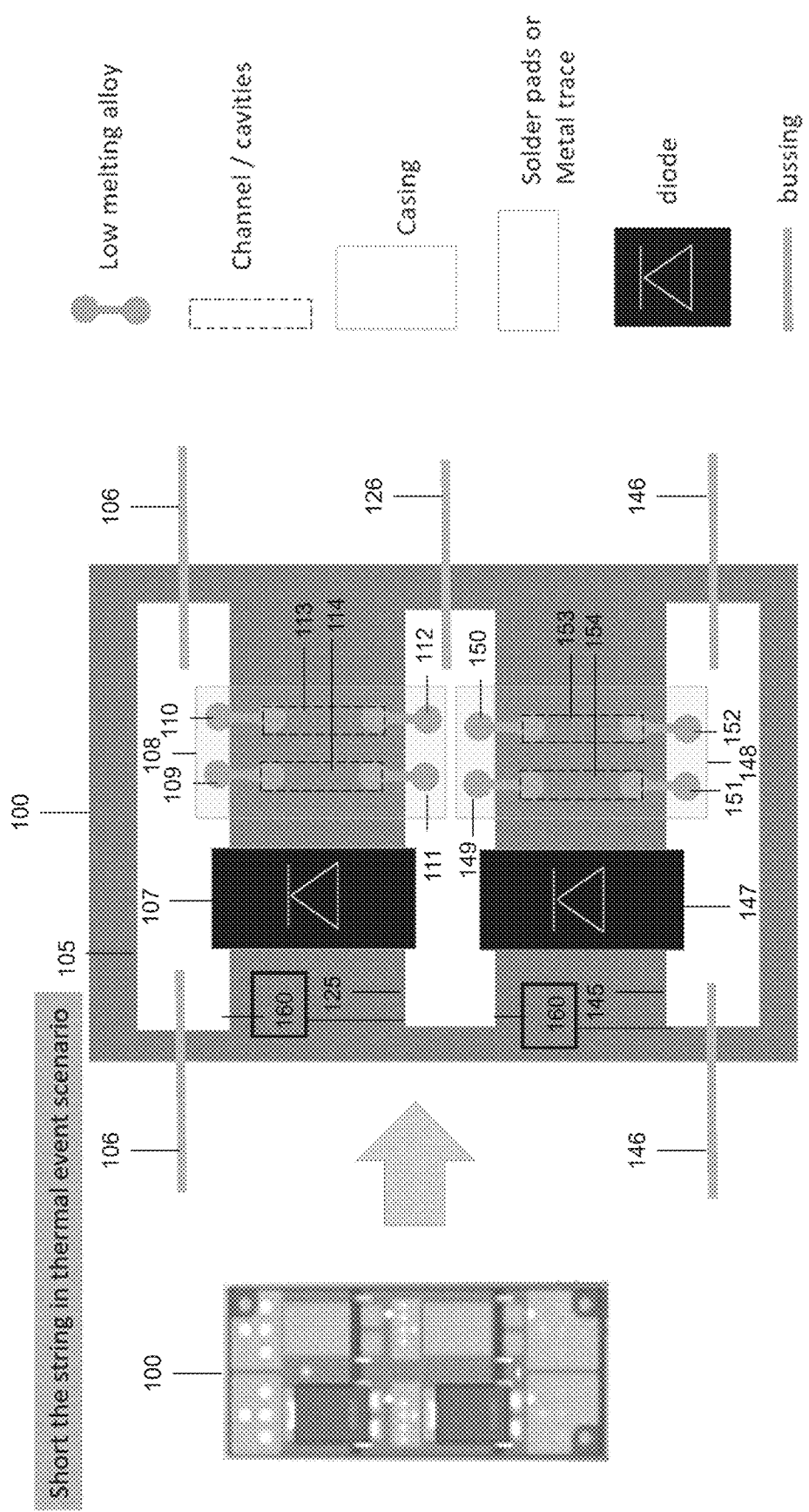
FIG. 4 illustrates a printed circuit board and accompanying components for providing shorting failsafe functionality for photovoltaic modules in a system according to embodiments of the present disclosure.
Figure 5:
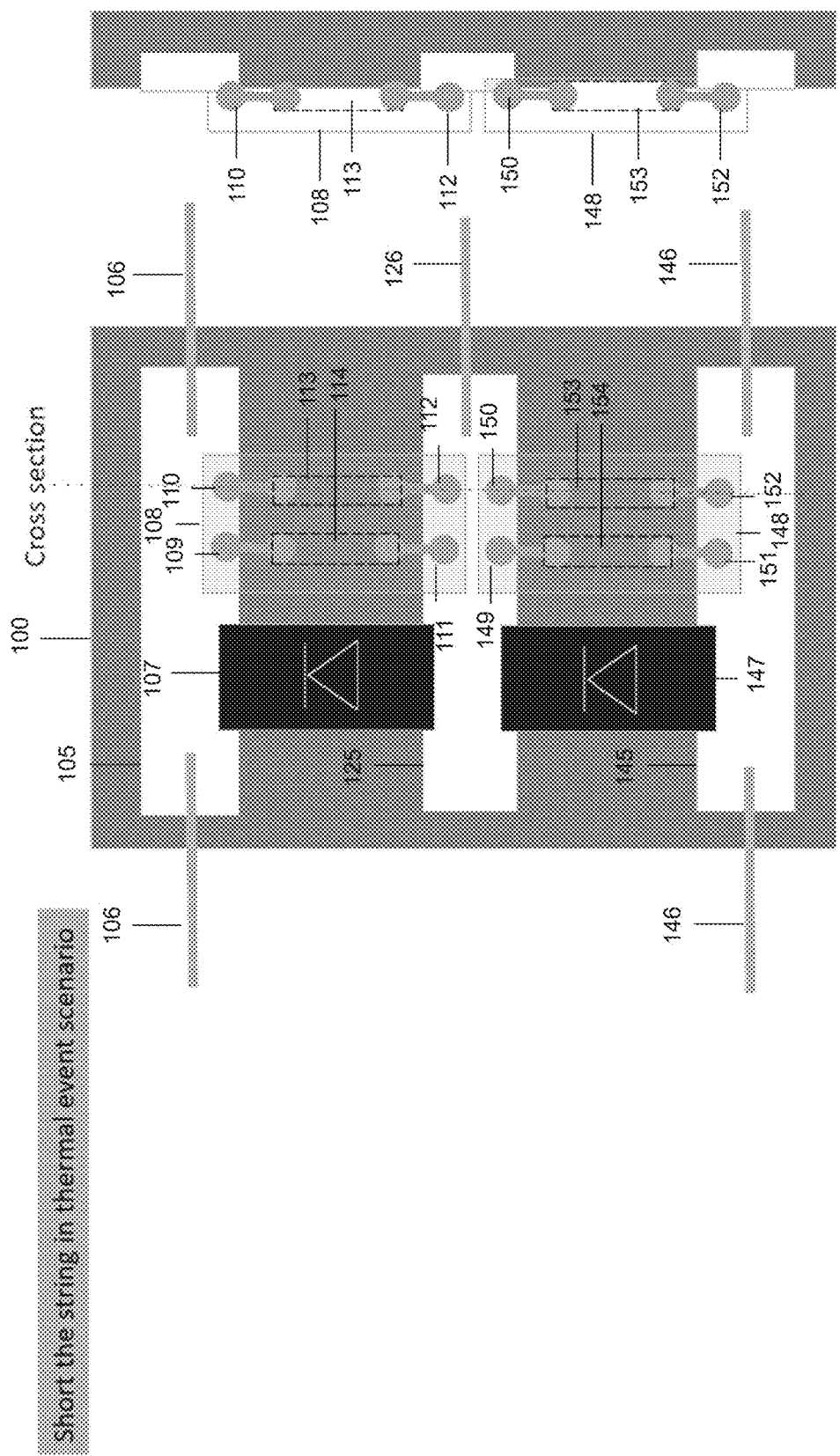
FIG. 5 illustrates the printed circuit board of FIG. 4 and a cross-sectional view of the printed circuit board for providing shorting failsafe functionality for photovoltaic modules in a system according to embodiments of the present disclosure.
Figure 6:
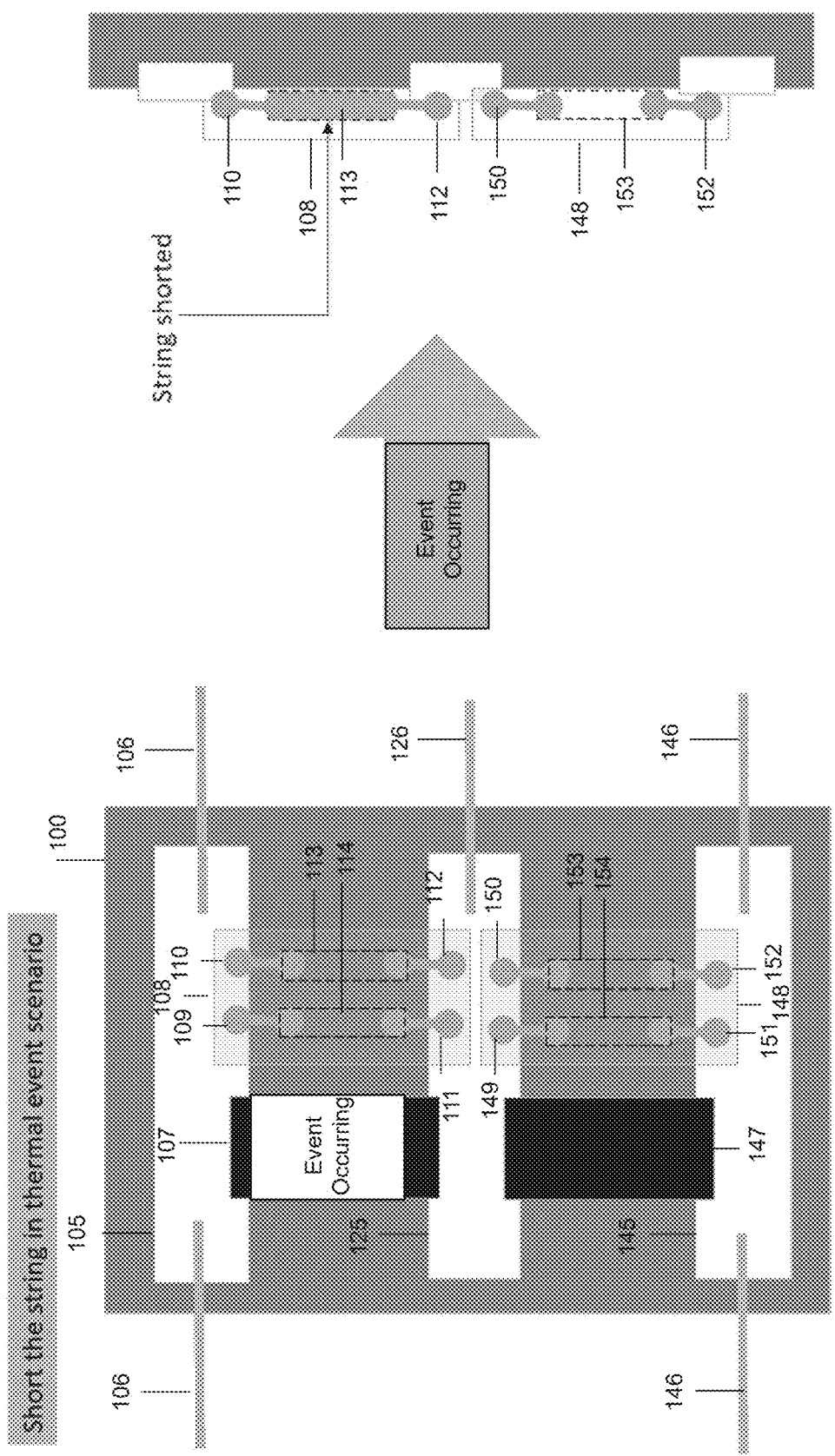
FIG. 6 illustrates shorting a photovoltaic string upon occurrence of an event to provide failsafe functionality for photovoltaic modules in a system according to embodiments of the present disclosure.

Referring now also to FIGS. 4, 5, and 6, embodiments of a printed circuit board 100 and accompanying components for providing shorting failsafe functionality for photovoltaic modules in a system according to embodiments of the present disclosure. In certain embodiments, the printed circuit board 100 can be laminated into a photovoltaic module and/or housed within a junction box (e.g., junction box 26) connected to a photovoltaic module (e.g., photovoltaic module 10). In certain embodiments, the printed circuit board 100 can include any number of components including, but not limited to, solder pads (and/or metal traces) 105, 125, 145, bussing (e.g., bussing circuit) 106, 126, 146, bypass diodes 107, 147, casings 108, 148, low melting alloys (e.g., metal alloys or traces) 109, 110, 111, 112, 149, 150, 151, 152, channels 113, 114, 153, 154, a temperature activated/actuated switch 160, any other components, or a combination thereof. In certain embodiments, the printed circuit board 100 can be electrically connected to any number of photovoltaic modules 10, which can include any number of photovoltaic substrings containing any number of photovoltaic cells. Illustratively, the printed circuit board 100 can be configured to include solder pads 105, 125, 145, which can be utilized for interconnecting the substrings of the photovoltaic module 10 and for making electrical connections between photovoltaic cells and other components of the printed circuit board 100. In certain embodiments, for example, the solder pads 105, 125 can be connected to bypass diode 107, solder pads 125, 145 can be connected to bypass diode 147, bussings 106 can be connected to solder pad 105 and/or photovoltaic substrings, bussings 126 can be connected to solder pad 125 and/or photovoltaic substrings, and bussings 146 can be connected to solder pad 145 and/or photovoltaic substrings.

Additionally, in certain embodiments, one end of a casing 108 can be connected to solder pad 105 and another end of the casing 108 can be connected to solder pad 125. Similarly, one end of a casing 148 can be connected to solder pad 125 and another end of the case 148 can be connected to solder pad 145. In certain embodiments, the casing 108 can serve as a cover for low melting alloys 109, 110, 111, 112, and casing 148 can serve as a cover for low melting alloys 148, 150, 151, 152. In certain embodiments, channel 114 can reside between one end of low melting alloy 109 and one end of low melting alloy 111, channel 113 can reside between one end of low melting alloy 110 and one end of low melting alloy 112, channel 154 can reside between one end of low melting alloy 149 and one end of low melting alloy 151, and channel 153 can reside between one end of low melting alloy 150 and one end of low melting alloy 152. In certain embodiments, in a default state, as shown in FIG. 4, non-continuous paths between the solder pads (or traces) 105, 125, 145 are shown. However, when an event occurs, such as overheating of a bypass diode 107, as shown in FIG. 6, the corresponding low melting alloys 109, 110, 111, 112 in proximity to the overheating bypass diode 107 can melt. Once the low melting alloys 109, 110, 111, 112 in proximity to the overheating bypass diode 107 melt, the low melting alloy 109 can connect with low melting alloy 111 via the channel 114 and low melting alloy 110 can connect with low melting alloy 112 via the channel 113. Once the low melting alloys 109, 110, 111, 112 connect based on the melting, a short is created in the circuitry whereby a continuous path for current to flow is created to provide failsafe functionality to bypass the bypass diode 107 that has overheated. Based on the foregoing, circuitry and components including, but not limited to, the printed circuit board 100 and photovoltaic strings in parallel with the diode 107 can be protected.

FIGS. 4 and 5 illustrate the low melting alloys 109, 110, 111, 112 in a pre-melted state and where an event has not yet occurred or is not yet affecting the printed circuit board 100 components and circuitry. FIG. 6 illustrates bypass module 107 experiencing an event that causes overheating and where the low melting alloys 109, 110, 111, 112 in proximity to the bypass diode 107 melt to create the short circuit to bypass the bypass diode 107 to prevent and/or reduce damage to the printed circuit board 100 components and/or to photovoltaic modules and/or substrings connected to the printed circuit board 100.

In certain embodiments, another technique to provide shorting to bypass at bypass diode (or other component) experience an event is to utilize a temperature-activated/actuated switch 160. In certain embodiments, the temperature-activated/actuated switch 160 can be positioned adjacent to the bypass diodes 107, 147 or bypass circuitry. In the event the bypass diodes 107, 147 and/or bypass circuitry generate excessive heat, such as based on the occurrence of an event, the temperature-activated/actuated switch 160 can close the circuitry and bypass the failing or failed bypass diodes 107, 147. In certain embodiments, the closing of the circuitry can be permanent, however, in certain embodiments, the closing of the circuitry can be reversible. For example, when the event is no longer present and/or the excessive heat is no longer present, the temperature-activated/actuated switch 160 can be configured to reopen.

Figure 7:
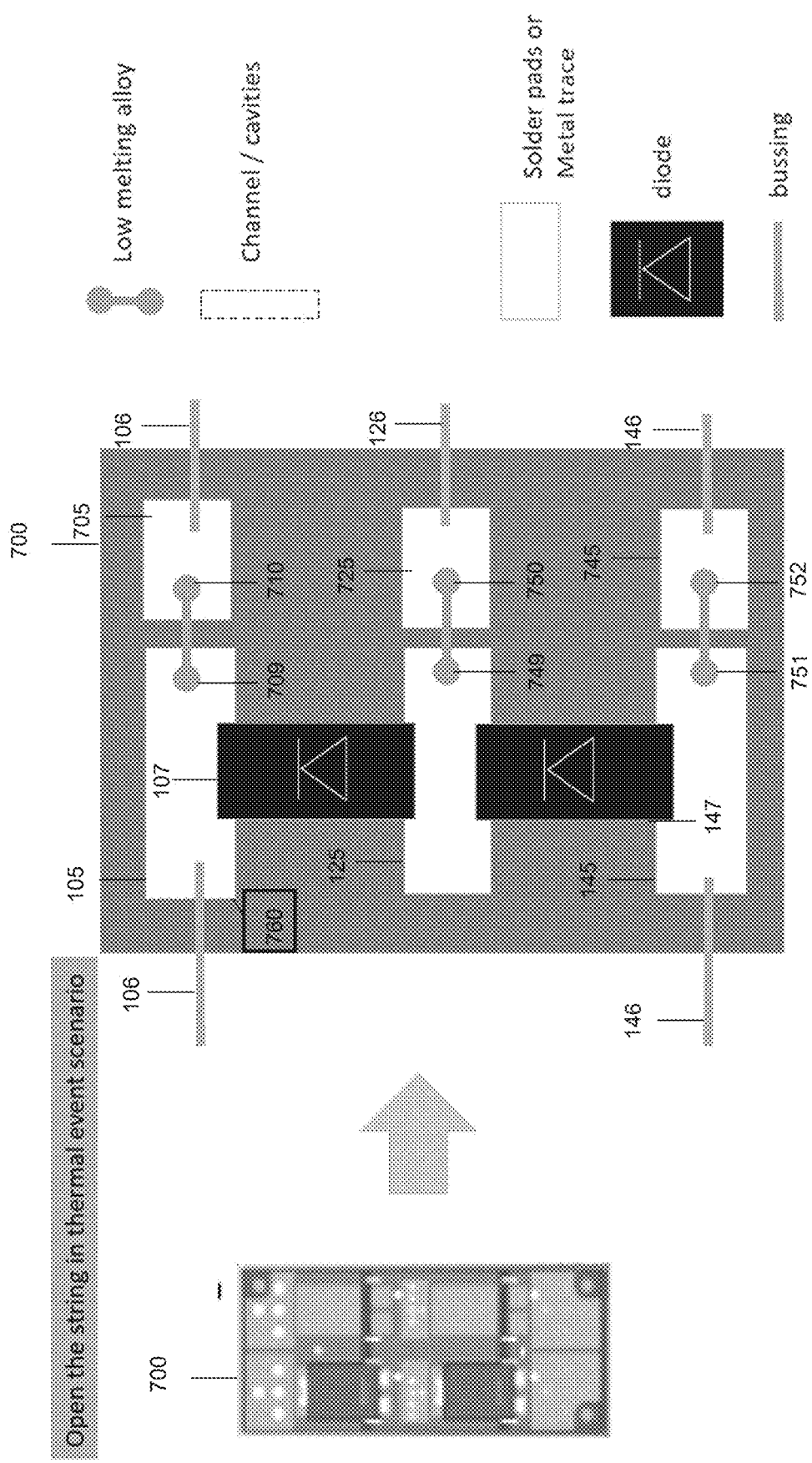
FIG. 7 illustrates a printed circuit board and accompanying components for providing open circuit failsafe functionality for photovoltaic modules in a system according to embodiments of the present disclosure.
Figure 8:
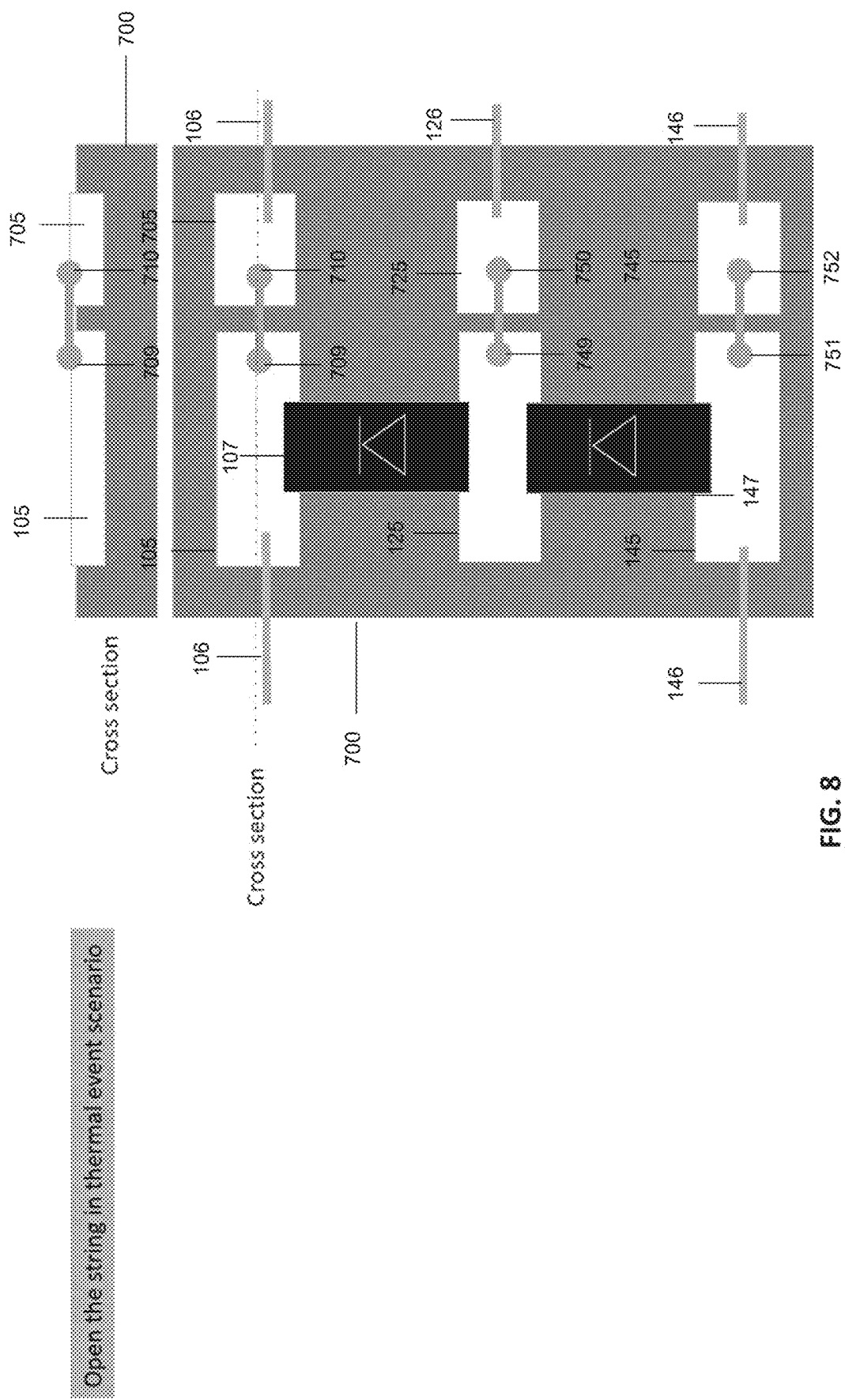
FIG. 8 illustrates the printed circuit board of FIG. 7 and a cross-sectional view of the printed circuit board for providing open circuit failsafe functionality for photovoltaic modules in a system according to embodiments of the present disclosure.
Figure 9:
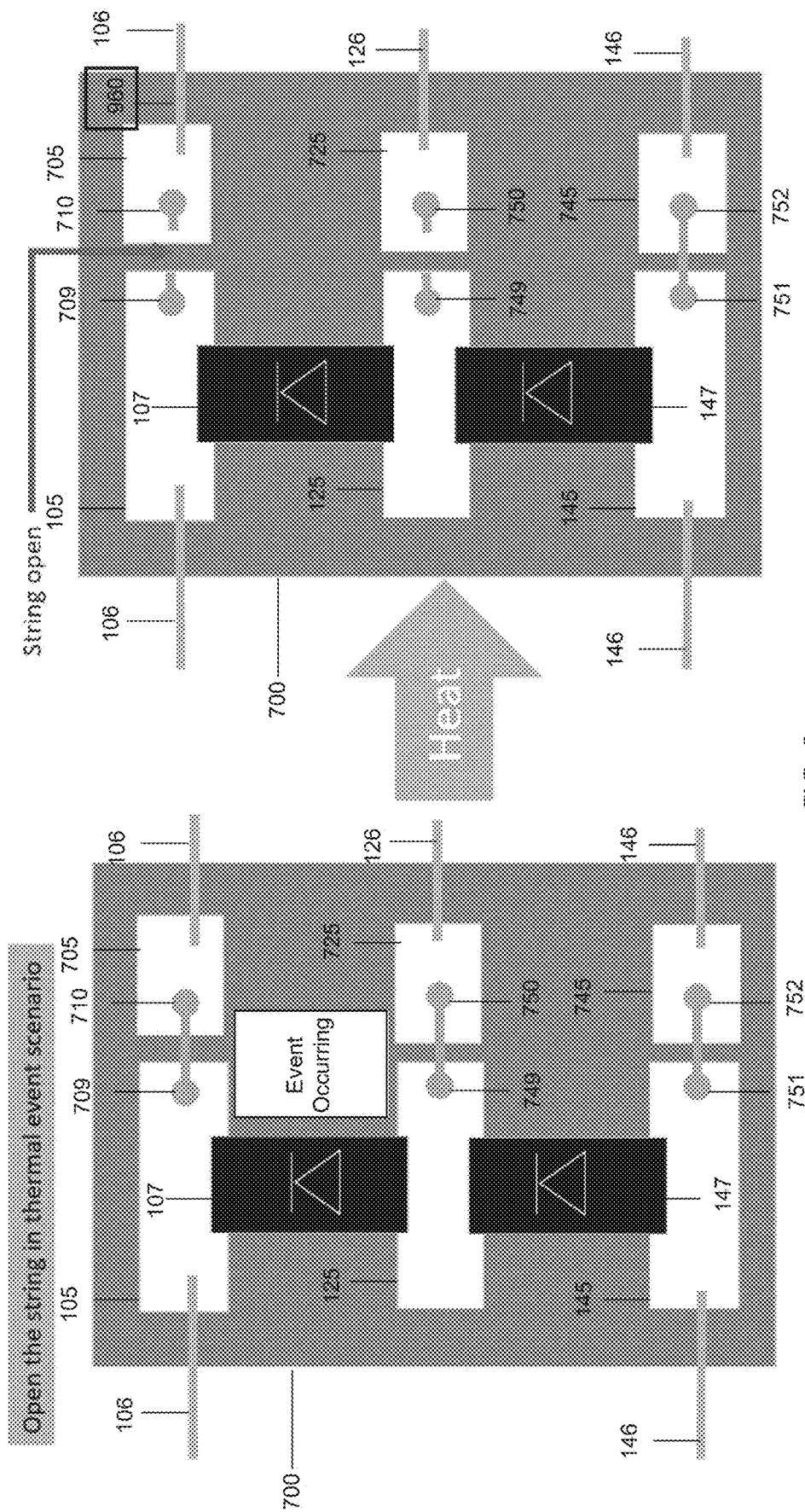
FIG. 9 illustrates opening a circuit associated with a photovoltaic string upon occurrence of an event to provide failsafe functionality for photovoltaic modules in a system according to embodiments of the present disclosure.

Referring now also to FIGS. 7, 8, and 9, embodiments of a printed circuit board 700 and accompanying components for providing open circuit failsafe functionality for photovoltaic modules in a system according to embodiments of the present disclosure are illustrated. In certain embodiments, as with the embodiments illustrated in FIGS. 4, 5, and 6, the printed circuit board 700 can be laminated into a photovoltaic module and/or housed within a junction box (e.g., junction box 26) connected to a photovoltaic module (e.g., photovoltaic module 10). In certain embodiments, the printed circuit board 700 can include any number of components including, but not limited to, solder pads (and/or metal traces) 105, 125, 145, 705, 725, 745, bussing (e.g., bussing circuit) 106, 126, 146, bypass diodes 107, 147, low melting alloys (e.g., metal alloys or traces) 709, 710, 749, 750, 751, 752, a temperature activated/actuated switch 760, any other components, or a combination thereof. In certain embodiments, the printed circuit board 700 can be electrically connected to any number of photovoltaic modules 10, which can include any number of photovoltaic substrings containing any number of photovoltaic cells. Illustratively, the printed circuit board 700 can be configured to include solder pads 105, 125, 145, 705, 725, 745, which can be utilized for interconnecting the substrings of the photovoltaic module 10 and for making electrical connections between photovoltaic cells and other components of the printed circuit board 700. In certain embodiments, for example, the solder pads 105, 125 can be connected to bypass diode 107, solder pads 125, 145 can be connected to bypass diode 147, bussings 106 can be connected to solder pads 105, 705 and/or photovoltaic substrings, bussings 126 can be connected to solder pads 125, 725 and/or photovoltaic substrings, and bussings 146 can be connected to solder pads 145, 745 and/or photovoltaic substrings.

In certain embodiments, the solder pad 105 can be connected to solder pad 705 via low melting alloys 709, 710, solder pad 125 can be connected to solder pad 725 via low melting alloys 749, 750, and solder pad 145 can be connected to solder pad 745 via low melting alloys 751, 752. In certain embodiments, the connections between solder pads 105, 705 that are made by the low melting alloys 709, 710 can constitute a bridge in series with photovoltaic substrings of the system. Similarly, the connections between solder pads 125, 725 via low melting alloys 749, 750 can constitute a bridge in series with photovoltaic substrings of the system. Furthermore, the connections between solder pads 145, 745 via low melting alloys 751, 752 can constitute a bridge in series with photovoltaic substrings of the system. In certain embodiments, the connections (or bridges) between the solder pads 105, 705, solder pads 125, 725, and solder pads 145, 745 can remain while there is no event, such as overheating of components of the printed circuit board 700. In the event that an event happens, as shown in FIG. 9, the low melting alloys 709, 710 and 749, 750 in proximity to the event can be configured to melt based on the heat. Once the low melting alloys 709, 710 and 749, 750 melt, the connections/bridges collapse and open the circuitry, as shown in FIG. 9, thereby preventing current from flowing and potentially damaging components including the photovoltaic substrings connected to the printed circuit board 700.

In certain embodiments, another technique to provide open circuit failsafe functionality can be provided. For example, a temperate-activated/actuated switch 760 can be positioned in series with the photovoltaic cell string. In certain embodiments, the temperate-activated/actuated switch 760 can be placed adjacent to a hotspot from the bypass circuit associated with the bypass diode 107 and/or 147 or have feedback from that region. When an event occurs, the temperate-activated/actuated switch 760 can be configured to open and can cut the current through the photovoltaic substring. In certain embodiments, the temperate-activated/actuated switch 760 can also separate the photovoltaic substring from the string voltage and can eliminate the risk of photovoltaic cells from going into breakdown mode.

Figure 10:
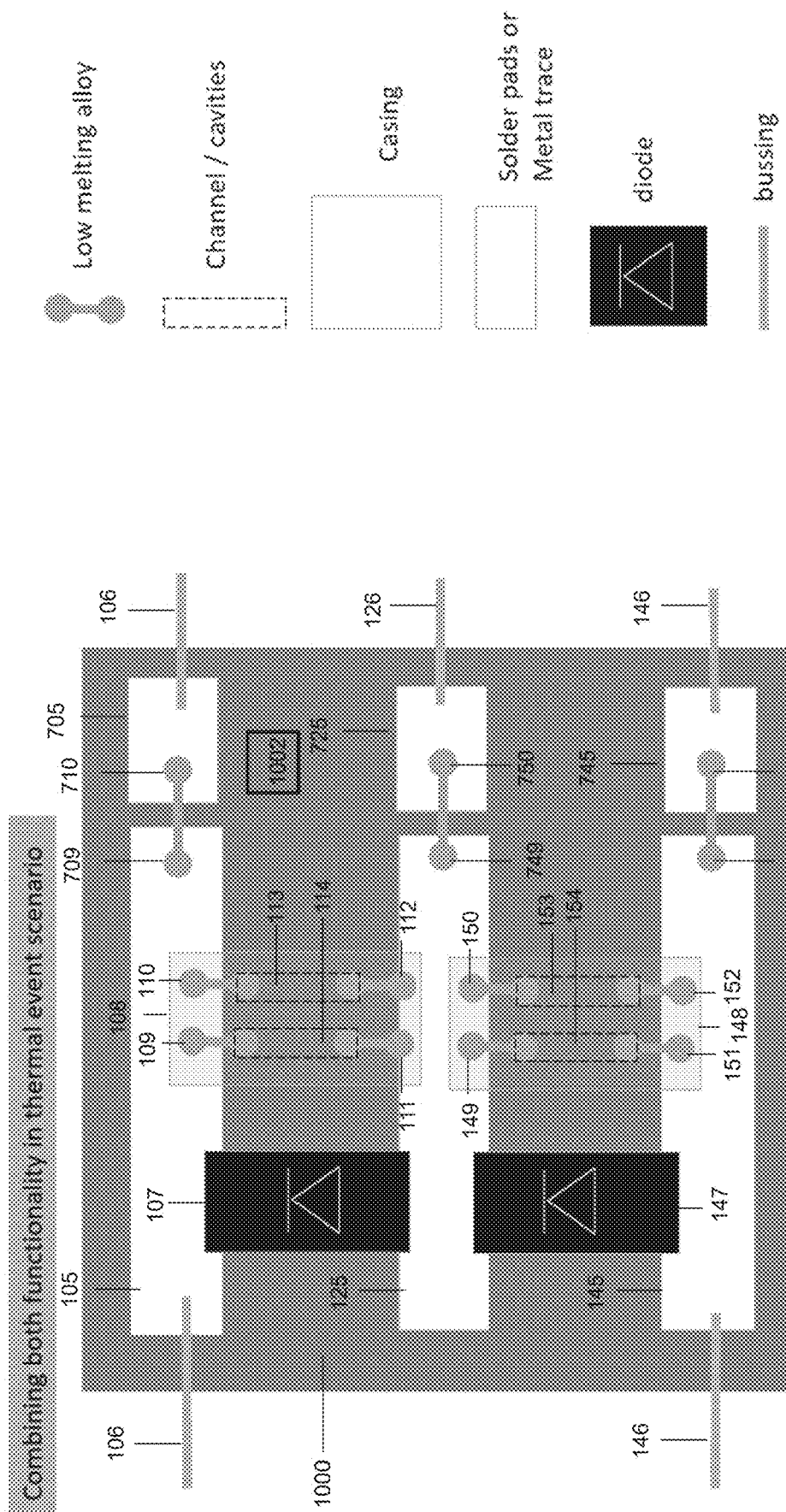
FIG. 10 illustrates a printed circuit board and accompanying components for providing both shorting failsafe functionality and open circuit failsafe functionality for photovoltaic modules in a system according to embodiments of the present disclosure.

Referring now also to FIG. 10, printed circuit board 1000 and accompanying components for providing both shorting failsafe functionality and open circuit failsafe functionality for photovoltaic modules in a system according to embodiments of the present disclosure is shown. In certain embodiments, the printed circuit board 1000 can include any number of components including, but not limited to, solder pads (and/or metal traces) 105, 125, 145, 705, 725, 745, bussing (e.g., bussing circuit) 106, 126, 146, bypass diodes 107, 147, low melting alloys (e.g., metal alloys or traces) 109, 110, 111, 112, 149, 150, 151, 152, 709, 710, 749, 750, 751, 752, channels 113, 114, 153, 154, a microchip 1002, a temperature activated/actuated switch, any other components, or a combination thereof. When an event occurs, the low melting alloys 109, 110, 111, 112, 149, 150, 151, 152 can be configured to melt within the corresponding channels 113, 114, 153, 154 depending on whether the event is occurring in a vicinity. Once the low melting alloys 109, 110, 111, 112, 149, 150, 151, 152 are melted, the circuit can be shorted, thereby bypassing any bypass diodes undergoing an event. Similarly, if an event occurs in proximity to the melting alloys 709, 710, 749, 750, 751, 752, the bridges formed between the solder pads 105, 705, solder pads 125, 725, and/or solder pads 751, 752 can collapse, thereby causing an opening of the corresponding circuitry, which can serve to protect the photovoltaic substrings and/or other components connected to the printed circuit board 1000. In certain embodiments, the microchip 1002 can be configured to manage the open and closed states of the circuitry of the printed circuit board 1000. In certain embodiments, the temperature can be taken at various locations on the printed circuit board 1000 as inputs using integrated circuit sensors (e.g., temperature sensors).

Referring now also to FIG. 11, exemplary solder alloys, melting ranges, and typical peak reflow temperatures for use with the printed circuit boards described herein are provided.

Figure 12:
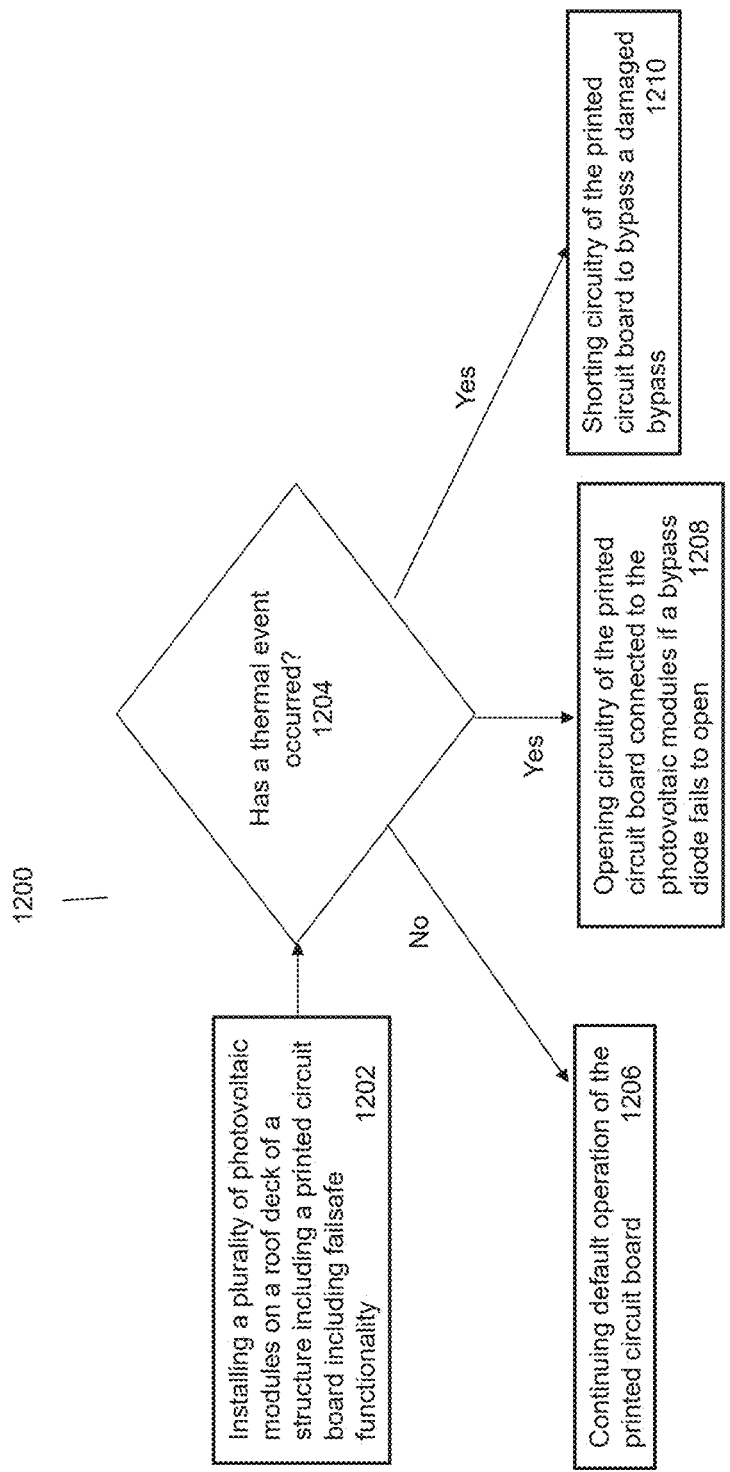
FIG. 12 illustrates an exemplary method for providing failsafe functionality for photovoltaic modules according to embodiments of the present disclosure.

Referring now also to FIG. 12, an exemplary method 1200 for providing failsafe functionality is provided. In certain embodiments, the method 1200 can include, at step 1204, installing a plurality of photovoltaic modules on a roof deck of a structure including a printed circuit board including failsafe functionality. In certain embodiments, the method 1200 can include, at step 1204, determining whether an event has occurred. If the terminal event is not determined to have occurred, the method 1200 can proceed to step 1206 by continuing the default operation of the printed circuit board providing the failsafe functionality. If the terminal event has occurred, the method 1200 can proceed to step 1208 by opening circuitry of the printed circuit board connected to the photovoltaic modules if a bypass fails to open, or the method 1200 can proceed to step 1210 by shorting circuitry of the printed circuit board to bypass a bypass diode (e.g., a damaged bypass diode).

The illustrations of arrangements described herein are intended to provide a general understanding of the structure of various embodiments, and they are not intended to serve as a complete description of all the elements and features of devices and systems that might make use of the structures described herein. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention.

Combinations of the above arrangements, and other arrangements not specifically described herein, will be apparent to those of skill in the art upon reviewing the above description. Therefore, it is intended that the disclosure is not limited to the particular arrangement(s) disclosed as the best mode contemplated for carrying out this invention, but that the invention will include all embodiments and arrangements falling within the scope of the appended claims.

The foregoing is provided for purposes of illustrating, explaining, and describing embodiments of this invention. Modifications and adaptations to these embodiments will be apparent to those skilled in the art and may be made without departing from the scope or spirit of this invention. Upon reviewing the aforementioned embodiments, it would be evident to an artisan with ordinary skill in the art that said embodiments can be modified, reduced, or enhanced without departing from the scope and spirit of the claims described below.

We claim:

1. A system, comprising:
a plurality of photovoltaic modules installed on a roof deck of a structure, wherein each of the plurality of photovoltaic modules comprise a plurality of photovoltaic substrings comprising a plurality of photovoltaic cells; and
a printed circuit board electrically connected to the plurality of photovoltaic modules installed on the roof deck of the structure, wherein the printed circuit board comprises:
at least one bypass diode configured to bypass, upon occurrence of a condition, at least one photovoltaic substring of the plurality of photovoltaic substrings;
a plurality of solder pads connected to the at least one bypass diode;
a channel; and
a casing connected to a first solder pad and a second solder pad of the plurality of solder pads, wherein the casing comprises:
a first low melting alloy and a second low melting alloy,
wherein when the first low melting alloy and the second low melting alloy reach a threshold temperature based on an event affecting the at least one bypass diode, the first low melting alloy and the second low melting alloy melt towards each other in the channel such that the first low melting alloy and the second low melting alloy connect to each other to form a continuous path between the first solder pad and the second solder pad, thereby shorting circuitry connecting at least one of the plurality of photovoltaic substrings to the first solder pad, the second solder pad, or a combination thereof, to provide a failsafe for the at least one of the plurality of substrings by bypassing the at least one bypass diode.

2. The system of claim 1, wherein the system further comprises a bussing connected to the first solder pad, the second solder pad, or a combination thereof, that connects to the at least one of the plurality of photovoltaic substrings.

3. The system of claim 1, wherein, when the threshold temperature is no longer present, the first low melting alloy and the second low melting alloy convert to a solid state, thereby causing disconnection between the first low melting alloy and the second low melting alloy within the channel, thereby forming a non-continuous path between the first solder pad and the second solder pad.

4. The system of claim 1, wherein the system further comprises a junction box configured to house the printed circuit board and connect with the plurality of photovoltaic modules.

5. The system of claim 1, wherein the printed circuit board is laminated within at least one of the photovoltaic modules of the plurality of photovoltaic modules.

6. The system of claim 1, wherein the casing is configured to cover the first low melting alloy, the second low melting alloy, the channel, or a combination thereof.

7. The system of claim 1, wherein the printed circuit board further comprises a temperature-activated switch in proximity to the at least one bypass diode, wherein the temperature-activated switch is configured to close the circuitry and bypass the at least one bypass diode when the threshold temperature is reached based on the event.

8. The system of claim 7, wherein the temperature-activated switch is further configured to open when the threshold temperature is not reached.

9. The system of claim 1, wherein the system further comprises:
a third low melting alloy configured to connect the first solder pad to a third solder pad, thereby forming a first bridge in series with the at least one of the plurality of photovoltaic substrings; and
a fourth low melting alloy configured to connect the second solder pad to fourth solder pad, thereby forming a second bridge at least one other photovoltaic substring of the plurality of photovoltaic substrings.

10. The system of claim 9, wherein, when the threshold temperature based on the event is reached, the first bridge, the second bridge, or a combination thereof, melt and collapse, thereby opening the circuitry connecting to the at least one of the plurality of photovoltaic substrings.

11. The system of claim 1, wherein the system further comprises:
a temperature-activated switch positioned in series with the at least one of the plurality of photovoltaic substrings, wherein the temperature-activated switch is configured to:
remain closed in a default state; and
open when the threshold temperature based on the event is reached, thereby opening the circuitry connecting to the at least one of the plurality of photovoltaic substrings.

12. A method, comprising:
installing a plurality of photovoltaic modules comprising a plurality of photovoltaic substrings on a roof deck of a structure, wherein at least one of the plurality of plurality of photovoltaic modules comprises:

a printed circuit board electrically connected to the plurality of photovoltaic modules installed on the roof deck of the structure, wherein the printed circuit board comprises:
  at least one bypass diode configured to bypass, upon occurrence of a condition, at least one photovoltaic substring of the plurality of photovoltaic substrings;
  a plurality of solder pads connected to the at least one bypass diode;
  a channel; and
  a casing connected to a first solder pad and a second solder pad of the plurality of solder pads, wherein the casing comprises:
    a first low melting alloy and a second low melting alloy;
facilitating, when a threshold temperature based on an event affecting the at least one bypass diode is reached at the first low melting alloy and the second low melting alloy, a connection between the first low melting alloy and the second low melting alloy as the first low melting alloy and the second low melting alloy melt towards each other via the channel, the connection forming a continuous path between the first solder pad and the second solder pad; and
shorting circuitry connecting at least one of the plurality of photovoltaic substrings to the first solder pad, the second solder pad, or a combination thereof, to provide a failsafe for the at least one of the plurality of substrings by bypassing the at least one bypass diode.

13. The method of claim 12, further comprising forming a non-continuous path between the first solder pad and the second solder pad when the threshold temperature is no longer present, wherein the non-continuous path is formed based on disconnection between the first low melting alloy and the second low melting alloy within the channel as the first low melting alloy and the second low melting alloy convert to a solid state.

14. The method of claim 12, further comprising closing the circuitry and bypassing the at least one bypass diode by utilizing a temperature-activated switch in proximity to the at least one bypass diode that is activated when the threshold temperature based on the event is reached.

15. The method of claim 14, further comprising opening the circuitry when the threshold temperature is not reached.

16. The method of claim 12, further comprising forming a bridge in series with that least one of the plurality of photovoltaic substrings using a third low melting allow configured to connect the first solder pad to a third solder pad.

17. The method of claim 16, further comprising opening the circuitry connecting to the at least one of the plurality of photovoltaic substrings when the threshold temperature based on the event is reached.

18. A shingle, comprising:
a plurality of photovoltaic modules comprising a plurality of photovoltaic substrings installed on a roof deck of a structure; and
a printed circuit board electrically connected to the plurality of photovoltaic modules comprising the plurality of photovoltaic substrings, wherein the printed circuit board comprises:
  at least one bypass diode configured to bypass, upon occurrence of a condition, at least one photovoltaic substring of the plurality of photovoltaic substrings;
  a plurality of solder pads connected to the at least one bypass diode;
  a channel; and
  a casing connected to a first solder pad and a second solder pad of the plurality of solder pads, wherein the casing comprises:
    a first low melting alloy and a second low melting alloy,
  wherein, when the first low melting alloy and the second low melting alloy reach a threshold temperature based on an event affecting the at least one bypass diode, the first low melting alloy and the second low melting alloy melt within in the channel such that the first low melting alloy and the second low melting alloy connect to each other to form a continuous path between the first solder pad and the second solder pad, thereby shorting circuitry connecting at least one of the plurality of photovoltaic substrings to the first solder pad, the second solder pad, or a combination thereof, to provide a failsafe for the at least one of the plurality of substrings by bypassing the at least one bypass diode.

19. The shingle of claim 18, further comprising:
a temperature-activated switch positioned in series with the at least one of the plurality of photovoltaic substrings, wherein the temperature-activated switch is configured to:
open when the threshold temperature based on the event is reached, thereby opening the circuitry connecting to the at least one of the plurality of photovoltaic substrings.

20. The shingle of claim 18, further comprising:
a third low melting alloy configured to connect the first solder pad to a third solder pad, thereby forming a first bridge in series with the at least one of the plurality of photovoltaic substrings; and
a fourth low melting alloy configured to connect the second solder pad to fourth solder pad, thereby forming a second bridge at least one other photovoltaic substring of the plurality of photovoltaic substrings, wherein, when the threshold temperature based on the event is reached, the first bridge, the second bridge, or a combination thereof, melt and collapse, thereby opening the circuitry connecting to the at least one of the plurality of photovoltaic substrings.

* * * * *